United States Patent
Li

(10) Patent No.: US 6,452,529 B1
(45) Date of Patent: Sep. 17, 2002

(54) FULLY DIFFERENTIAL FOLDING A/D CONVERTER ARCHITECTURE

(76) Inventor: Qunying Li, 1 Ari Dr., Apt. D, Somerset, NJ (US) 08873

( * ) Notice: Subject to any disclaimer, the term of this patent is extended or adjusted under 35 U.S.C. 154(b) by 0 days.

(21) Appl. No.: 09/761,919

(22) Filed: Jan. 17, 2001

(51) Int. Cl.$^7$ ................................................ H03M 1/12
(52) U.S. Cl. ...................................... 341/156; 341/155
(58) Field of Search ................................ 341/154, 155, 341/159, 156

(56) References Cited

U.S. PATENT DOCUMENTS

| | | | |
|---|---|---|---|
| 4,270,118 A | 5/1981 | Brokaw | 341/159 |
| 4,386,339 A | 5/1983 | Henry et al. | 341/159 |
| 4,831,379 A | 5/1989 | van de Plassche | 341/156 |
| 5,416,484 A | * 5/1995 | Lofstrom | 341/159 |
| 5,751,236 A | 5/1998 | Vorenkamp et al. | 341/155 |
| 5,835,047 A | 11/1998 | Vorenkamp et al. | 341/155 |
| 5,877,718 A | * 3/1999 | Andoh et al. | 341/155 |

* cited by examiner

*Primary Examiner*—Peguy JeanPierre
(74) *Attorney, Agent, or Firm*—W. Daniel Swayze, Jr.; W. James Brady; Frederick J. Telecky, Jr.

(57) ABSTRACT

The present invention relates to a differential folding analog-to-digital converter architecture which comprises a plurality of folders. Each of the plurality of folders comprises a plurality of pre-amplifier circuits, wherein each of the folders is operable to generate a plurality of crossing points associated with the pre-amplifier circuits when an input signal changes in a full range. In addition, the plurality of pre-amplifier circuits associated with each respective folder are located generally next to one another which reduces a connection distance associated with the pre-amplifier circuits and an output node of each folder and reduces a parasitic capacitance associated with the output node. Further, the architecture comprises a reference voltage generation circuit operable to provide a plurality of reference voltage levels to the plurality of folders. The reference voltage generation circuit is configured to provide selected reference voltage levels spatially local to each of the plurality of folders, respectively, which reduces a connection complexity between the reference voltage generation circuit and the plurality of folders.

10 Claims, 4 Drawing Sheets

FULLY DIFFERENTIAL FOLDING A/D CONVERTER ARCHITECTURE

FIELD OF THE INVENTION

The present invention relates in general to the field of electronic circuits, and more particularly to a system and method for performing analog to digital signal conversion using a folding A/D converter architecture.

BACKGROUND OF THE INVENTION

Important considerations in designing an analog-to-digital A/D converter are speed, component count, and resolution. Flash-type A/D converters provide, in many cases, the greatest speed. To convert an analog input voltage into an n-bit digital output code, a flash converter usually has $2^n-1$ input comparators that compare the input voltage with $2^n-1$ corresponding reference voltages supplied from a resistive voltage divider. The comparators thus trip at different levels based on their corresponding reference voltages and their outputs, which provide an indication of the input magnitude, are latched subsequently.

The principal disadvantage of the flash converter is a large component count due to the large number of input comparators. A large chip area is needed to implement the device in integrated circuit form. Numerous schemes have been proposed to cut the number of comparators (see, e.g., U.S. Pat. Nos. 4,270,118 and 4,386,339). These schemes normally accept a loss in conversion speed as a compromise.

A "folding" system is one of the more promising techniques for reducing component count. In a folding A/D converter, a set of input amplifiers respond to the input voltage and a corresponding set of reference voltages in such a way as to generate one or more pairs of complementary waveforms that have a repetitive rounded triangular shape as a function of the input voltage. A group of fine comparators convert these sawtooth waveforms into a string of bits which are encoded into the least significant bits of the output code. The most significant bits ere supplied from a group of coarse comparators which operate on-the input voltage along a separate channel from the folding array.

The chip area for a folding A/D converter is reduced dramatically because it utilizes considerably fewer circuit components than an otherwise equivalent flash converter. By converting the analog input into a piecewise-linear periodic function of the input signal, the output of the A/D converter exhibits a dramatically reduced dynamic range than its corresponding input signal. Consequently, the AND converter is desirable over conventional converters in certain circuit applications because the folded waveform can be digitized utilizing substantially fewer-latches, thereby reducing die area and power consumption.

An exemplary conventional 6-bit folding A/D converter circuit exhibiting a 2-to-1 type folding function is illustrated in prior art FIG. 1, and designated at reference numeral 100. The A/D conversion is made by comparing a differential analog input signal 102*a*, 102*b* with 64 uniformly spaced differential reference voltage levels 104 (e.g., V64+, V64−, V63+, V63−, etc.). The differential reference voltage levels 104 may be derived from two voltage divider circuits which include 63 series-connected resistors and is sometimes referred to as a resistor ladder.

As illustrated in prior art FIG. 1, the 2-to-1 folding scheme includes 32 folders 106 involving 64 comparator or pre-amplifier circuits 108 and 32 dummy comparator or pre-amplifier circuits 110. To form a folder 106, for example, the differential output nodes of pre-amplifier P64 and P32, along with dummy pre-amplifier D32, are connected together and coupled to a latch 112 in the manner illustrated. The input of each dummy pre-amplifier 110 is configured such that one side of the input differential pair (not shown) is conducting all the current and the other side is cut off.

When the analog input signal 102*a*, 102*b* is at a level close to the differential reference voltage level associated with pre-amplifier P64 (V64+, V64−), P64 is functional (causing its output to trip) while the current contributions from P32 and D32 to their output nodes are balanced. Similarly, when the analog input signal 102*a*, 102*b* is at a level which is close to the differential reference voltage level associated with the pre-amplifier P32, P32 is functional while the current contributions from P64 and D32 are balanced. Therefore each folder 106 provides indications which correspond to two different "zero-crossing" points when the analog input signal 102*a*, 102*b* varies across its full range. Consequently, only half the number of latches 112 and corresponding digital processing circuitry (not shown) are needed, compared to a conventional full flash A/D architecture.

Although the prior art folding A/D converter 100 of FIG. 1 exhibits advantages over conventional flash AND architectures, the circuit layout of the converter 100 has some problems, particularly in high speed converter applications, for example, of about 500 MS/s or more. When the pre-amplifier circuits 108 are laid out as shown in FIG. 1, the electrical connections between the resistor ladders 104 and the appropriate pre-amplifiers are relatively short and simple, however, the folder output node connections are not. In particular, the output connection distance associated with pre-amplifiers and a latch in a single folder 106 (e.g., P64, P32 and D32) is substantial, as illustrated. The relatively large and complex folder output electrical layout connections result in an undesirably large parasitic capacitance at each folder output node. The large parasitic capacitance operates to reduce the speed of the converter and/or makes the converter consume a larger amount of power to achieve a specific desired speed.

Once conventional solution to the above problem with an undesirably large parasitic capacitance is to lay out the pre-amplifiers associated with a given folder proximate or geometrically close to one another. With such a configuration, the pre-amplifiers associated with a given folder are proximate or local to one another (e.g., P64, P32 and D32), and the output electrical connection distance for a particular folder is substantially reduced. Unfortunately, such a pre-amplifier layout configuration creates a problem with respect to the connection of the pre-amplifiers 108 to the differential reference voltage levels of the resistor ladder 104. Because the numerical order of the pre-amplifiers has been broken (as can be deduced from FIG. 1), but the differential reference voltage levels still follow a numerical order, as illustrated in FIG. 1, a tremendous amount of complex wiring and wiring-related issues (e.g., cross-over connections, line resistance) arise at the pre-amplifier inputs. Such wiring complexity issues are further exacerbated for N-to-1 folding architectures when N is greater than 2.

There is a need in the art for high speed folding A/D converters which overcome the limitations associated with the prior art.

SUMMARY OF THE INVENTION

The present invention relates to a folding A/D system architecture and method for reducing folder output parasitic capacitance while concurrently exhibiting a differential reference voltage circuit which is configured spatially to simplify the connections therefrom to the folder inputs, thus overcoming the disadvantages associated with the prior art.

The present invention comprises a differential folding A/D converter architecture. The architecture comprises a folder portion containing a plurality of folders in which multiple pre-amplifier circuits associated with a given folder are laid out or otherwise configured proximate one another to thereby reduce the length and complexity of the output connections associated therewith and thus reduce parasitic capacitance. In addition, the architecture comprises a differential reference voltage generation circuit, for example, a series-connected resistor ladder, operable to provide a plurality of differential reference voltages to the folder portion. Unlike the prior art, the differential reference voltage generation circuit is spatially configured with respect to the folder portion in such a manner that each differential reference voltage level is spatially local (e.g., geometrically close) to its respective pre-amplifier circuit, thereby minimizing a distance and complexity of electrical input connection lines between the differential reference voltage generation circuit and the folder portion.

According to one aspect of the present invention, the differential reference voltage generation circuit comprises a resistor ladder network composed of a plurality of series-connected resistors. The resistor ladder network further comprises a first U-shaped, series-connected resistor chain which is operable to provide selected differential reference voltage levels to one of the pre-amplifier circuits within each folder. Tap points for the various differential reference voltage levels for each pre-amplifier circuit are located on opposite sides of the U-shaped resistor chain and spatially located proximate to one another and proximate to the respective pre-amplifier circuit, thus minimizing a connection complexity between the tap points of the resistor chain and the pre-amplifier circuit associated therewith.

According to another aspect of the present invention, the resistor ladder network further comprises a second U-shaped, series connected resistor chain which is oriented in a manner opposite the first U-shaped resistor chain. The second resistor chain is operable to provide second differential reference voltage levels for a second pre-amplifier circuit within each folder. Tap points for the various differential reference voltage levels for each pre-amplifier circuit are located on opposite sides of the U-shaped resistor chain and spatially located proximate to one another and proximate to the respective pre-amplifier circuit, thus minimizing a connection complexity between the tap points of the resistor chain and the pre-amplifier circuit associated therewith.

According to still another aspect of the present invention, a method of reducing a connection distance and a connection complexity between differential voltage reference levels and a plurality of folders in a folding analog-to-digital converter is disclosed. The method comprises locating a plurality of pre-amplifier circuits proximate each other in each folder, wherein the pre-amplifier circuits of each folder are operable to provide an indication of crossing points with respect to different reference voltage levels associated with an analog input signal varying over its full range. The method further comprises configuring a differential reference voltage generation circuit such that a selected plurality of generated different differential reference voltages are spatially proximate to each of the plurality of folders, respectively, thereby reducing a connection complexity between the differential reference voltage generation circuit and the plurality of folders.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

The present invention is directed to a system architecture and method of reducing a connection distance and complexity between folder portions having geometrically close pre-amplifier circuits and a differential reference voltage generation circuit. More particularly, the differential reference voltage generation circuit is configured spatially so as to facilitate the reduction in connection distance and complexity to the folder. Therefore the present invention provides for reduced parasitic capacitance at the folder outputs while overcoming the limitations with respect to folder input connection complexity of the prior art.

Figure 2:
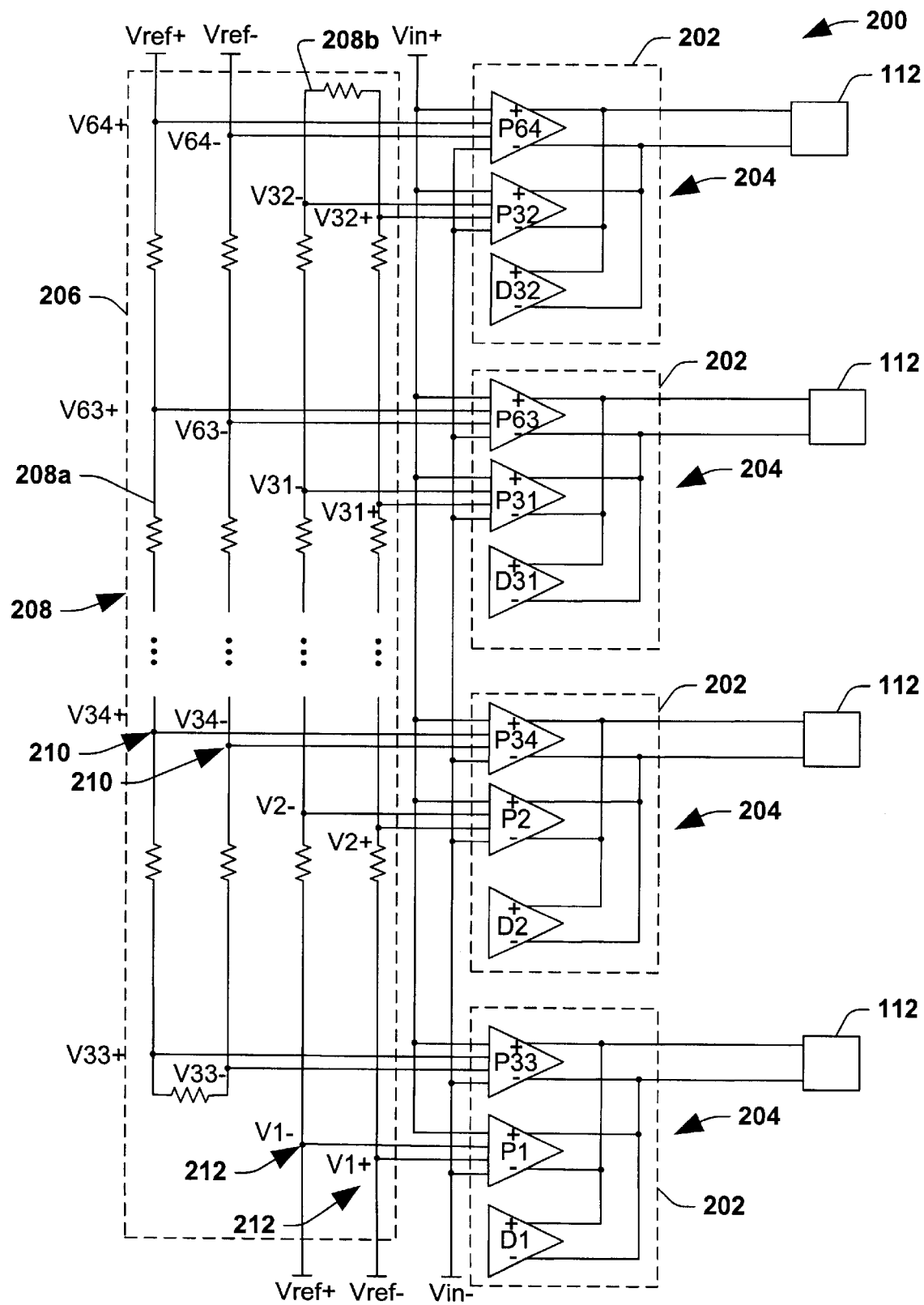
FIG. 2 is a schematic diagram illustrating a 2-to-1 folding type A/D architecture according to one exemplary aspect of the present invention.

Turning now to the figures, FIG. 2 is a schematic diagram illustrating a folding A/D converter architecture according to one exemplary aspect of the present invention, and is designated at reference numeral 200. The architecture 200 includes a plurality of folders 202. Each of the folders 202 have a plurality of pre-amplifier circuits 204 associated therewith, wherein a number of pre-amplifier circuits associated with each folder is a function of the type of folding being employed. For example, the exemplary architecture 200 illustrated in FIG. 2 is a 2-to-1 type folding architecture with each folder containing an additional dummy pre-amplifier circuit. Each of the pre-amplifier circuits 204 are operable to provide an indication of crossing points with respect to different differential reference voltage levels associated with a differential analog input signal (Vin+, Vin−) when the signal varies over its full range. Note that a dummy pre-amplifier circuit (e.g., D32) is included within each folder circuit 202 because due to the folding principle, an odd number of pre-amplifier circuits must be connected together to form a folder, even if one is not utilized.

Figure 1:
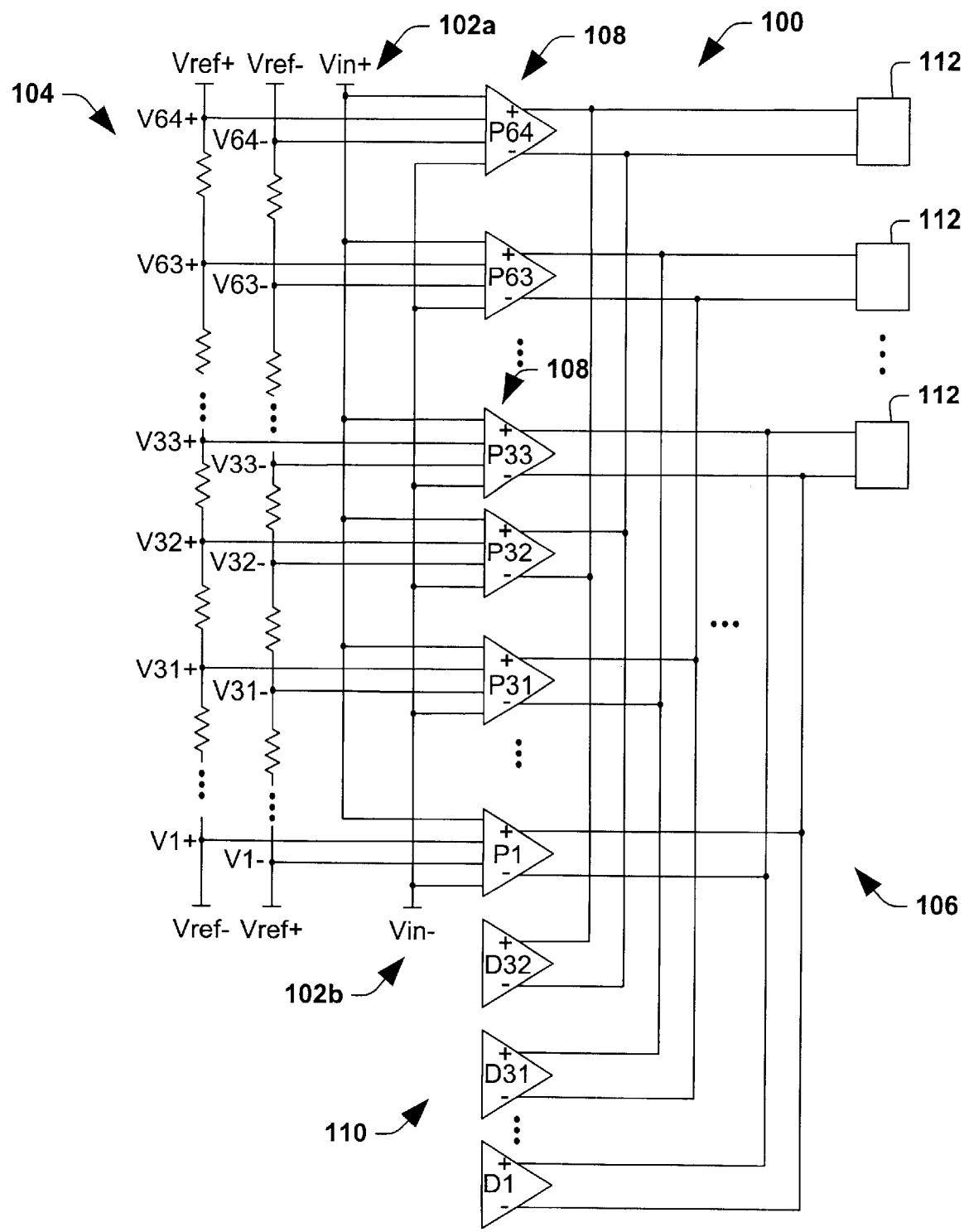
FIG. 1 is a schematic diagram illustrating a prior art folding type A/D architecture.

Each of the pre-amplifier circuits 204 associated with a given folder 202 are laid out in the circuit architecture 200 so as to be generally proximate or next to one another, as illustrated. Therefore the pre-amplifier circuit 204 output connections associated with each folder are substantially reduced over other architecture layouts, which results in reduced parasitic capacitance at the folder output. Consequently, the layout provides for either increased speed or reduced power consumption for a given speed over other layout architectures. In accordance with the present invention, the term proximate is meant to connote that the pre-amplifier circuits are spatially close to each other relative to other pre-amplifier circuits in other folders, as opposed to be spatially interleaved with pre-amplifier circuits associated with other folders as illustrated in prior art FIG. 1. It is intended that the term proximate be considered broadly in this context with regards to a particular dimensional requirement, knowing that with progression in technology, such dimensions will vary.

The architecture 200 of FIG. 2 also includes a reference voltage a generation circuit 206 which is operable to provide a plurality of differential reference voltage levels to the plurality of folders 202 in accordance with the layout of the pre-amplifier circuits 204 in the folders 202. According to one exemplary aspect of the present invention, the reference voltage generation circuit 206 is configured to provide selected ones of the differential reference voltage levels spatially local to each of the respective folders 202. That is, the differential reference voltage level associated with a respective pre-amplifier circuit 204 are physically close (e.g., vertically as shown in FIG. 2) to their respective pre-amplifier circuits and thus the connection distance and complexity associated therewith is reduced substantially.

According to one exemplary aspect of the present invention, the reference voltage generation circuit 206 may comprise a resistor ladder network 208, as illustrated in FIG. 2. At the input side of the pre-amplifier circuits 204, the resistor ladder is spatially configured with respect to their circuit layout such that each of the differential reference voltage levels are spatially local to their respective pre-amplifier circuit, for example, as illustrated. Such a spatial configuration provides for a simplified connection scheme between the reference voltage generation circuit and the various folders 202, respectively.

According to one exemplary aspect of the present invention, the resistor ladder or ladders 208 are bent into two sections at about their middle point and laid out as illustrated in FIG. 2,. That is, one ladder is in a U-shape and the. other one is in a U-shape and is oriented in a manner which is opposite the first ladder (e.g., one is right-side up and the other is upside down). Each ladder is powered with Vref+ and Vref− at its two terminals. For the i$^{th}$ pre-amplifier circuit 204, its corresponding reference Vi+ and Vi− are from the same resistor ladder, but from different positions; that is, on different sides at approximately the same vertical position of each side. The resistor ladder configurations of FIG. 2 give proper differential reference voltage levels and make the connection to the pre-amplifiers substantially simple and short.

More particularly, the resistor ladders 208 of FIG. 2 comprise a first U-shaped, series connected resistor chain 208a operable to provide differential reference voltage levels to one of the pre-amplifier circuits 204 associated with each of the folders 202. The resistor chain 208a contains tap points 210 for the differential reference voltage levels for each selected pre-amplifier circuit of a folder; the tap points 210 are located on opposite sides of the U-shaped resistor chain 208a and are spatially located proximate to each other vertically as shown, thereby minimizing a connection complexity between the resistor chain and each pre-amplifier circuit associated therewith.

In addition, the resistor ladder 208 comprises a second U-shaped, series connected resistor chain 208b oriented in a manner opposite the first U-shaped resistor chain. The second resistor chain 208b is operable to provide differential reference voltage levels to another one of the pre-amplifier circuits 204 associated with each of the folders 202. The second resistor chain 208b contains tap points 212 for the differential reference voltage levels for each selected pre-amplifier circuit. The tap points 212 are located on opposite sides of the second U-shaped resistor chain 208b and are spatially located proximate to each other, thereby minimizing a connection complexity between the resistor chain and each pre-amplifier circuit associated therewith. In the above manner, a folding A/D architecture is provided having reduced parasitic capacitance at the folder outputs while concurrently minimizing a connection complexity and distance between the reference voltage generation circuit and the folder inputs.

In the above manner, the present invention overcomes the shortcomings of the prior art.

Although the above discussion with respect to one exemplary aspect of the present invention is illustrated in conjunction with a 6-bit AND converter, other resolution AND converters may be employed, such as any n-bit A/D converter, wherein n is an integer greater than one. It should also be noted that 63 reference voltage levels (or equivalently 63 pre-amplifier circuits) are adequate for 6-bit A/D converter resolution. However, in FIG. 2, 64 pre-amplifier circuits are employed because the functional pre-amplifier circuits need to be in pairs to form the 2-to-1 folder. In practical operation, the 64$^{th}$ pre-amplifier circuit in the 2-to-1 folder architecture 200 is outside of the input full range and normally not utilized.

In addition, although the above discussion is illustrated in conjunction with a 2-to-1 folding architecture, the present invention also contemplates applicability to N-to-1 folding architectures, wherein N is an integer greater than 1. For example, turning to FIG. 3, a 3-to-1 folding type architecture is illustrated in accordance with another exemplary aspect of the present invention, and is designated at reference numeral 300. Recall that in a 2-to-1 folding A/D architecture, such as the architecture 200 of FIG. 2, each folder included a dummy pre-amplifier circuit in order to accommodate the folding principle. Unfortunately, the dummy pre-amplifier circuits may consume extra power and area without any substantial performance benefit associated therewith (besides the folding advantages already discussed). A 3-to-1 folding A/D architecture such as the architecture 300 of FIG. 3 improves the area efficiency and reduces the power consumption of an A/D converter. In addition, compared to conventional full flash A/D architectures, the 3-to-1 folding architectures reduce the number of latches and various digital processing circuits (e.g., flip-flops, bubble correction circuits, etc.) by about two-thirds (⅔).

The architecture 300 includes a plurality of folders 302. Each of the folders 302 have a plurality of pre-amplifier circuits 304 associated therewith, wherein a number of pre-amplifier circuits associated with each folder is a function of the type of folding being employed. Each of the pre-amplifier circuits 304 are operable to provide an indication of crossing points with respect to different differential reference voltage levels associated with a differential analog input signal (not shown in FIG. 3 for purposes of simplicity) when the signal varies over its full range.

Each of the pre-amplifier circuits 304 associated with each folder 302 are laid out in the circuit architecture 300 so as to be generally next to one another, as illustrated. Therefore the pre-amplifier circuit output connections associated with each folder are substantially reduced over other architecture layouts, which results in reduced parasitic capacitance at the folder output. Consequently, the layout provides for either increased speed or reduced power consumption for a given speed over other layout architectures.

Figure 3:
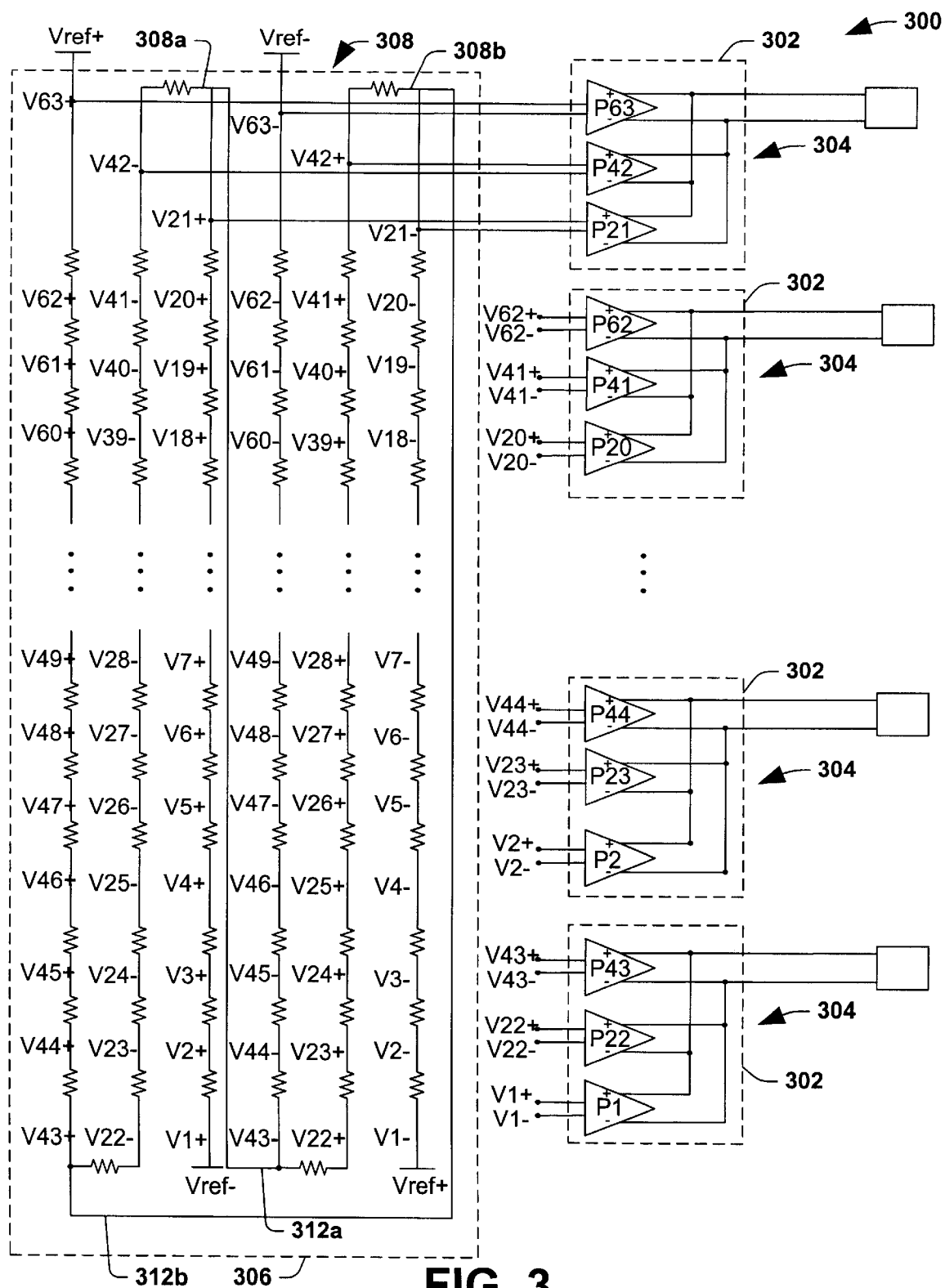
FIG. 3 is a schematic diagram illustrating a 3-to-1 folding type A/D architecture according to another exemplary aspect of the present invention.

The architecture 300 of FIG. 3 also includes a reference voltage generation circuit 306 which is operable to provide a plurality of differential reference voltage levels to the plurality of folders 302 in accordance with the layout of the pre-amplifier circuits 304 in the folders 302. According to one exemplary aspect of the present invention, the reference voltage generation circuit 306 is configured to provide selected ones of the differential reference voltage levels spatially local to each of the respective folders 302. That is, the differential reference voltage level associated with a respective pre-amplifier circuit 304 are physically close to their respective pre-amplifier circuits and thus the connection distance and complexity associated therewith is reduced substantially.

According to one exemplary aspect of the present invention, the reference voltage generation circuit 306 may comprise a resistor ladder network 308, as illustrated in FIG. 3. At the input side of the pre-amplifier circuits 304, the resistor ladder is spatially configured with respect to their circuit layout such that each of the differential reference voltage levels are spatially local to their respective pre-amplifier circuit, for example, as illustrated. Such a spatial configuration provides for a simplified connection scheme between the reference voltage generation circuit and the various folders 302, respectively.

According to one exemplary aspect of the present invention, the resistor ladder network 308 comprises two ladder chains 308a and 308b which are each bent into three sections and powered with Vref+ and Vref− at their terminals, as illustrated in FIG. 3. For example, when counting the reference voltage levels from top to the bottom, V63+, V62+, . . . V43+ are derived from a left side resistor ladder 308a, then V42+, V41+, . . . V22+ are derived from the right side resistor ladder 308b. After that, V21+, V20+, . . . V2+, V1+ are derived from the left side ladder 308a again. The reference voltages V63−, V62−, . . . V2−, V1− are derived from the ladders 308a and 308b in a similar manner. As illustrated in FIG. 3, it can be seen that the numerical order of the reference voltage levels correspond spatially to the pre-amplifier spatial ordering, thus making the respective reference voltage levels proximate or local to their appropriate pre-amplifier circuit. This layout configuration thus simplifies the connections between the voltage reference generation circuit 306 and the folders 302. As can be seen, the above architecture 300 minimizes the connection complexity and distance at the folder inputs and outputs.

Note that for purposes of simplicity, in FIG. 3 only the connection between the top 3-to-1 folder and the resistor ladders. is illustrated. It is understood that the remaining folders are coupled to the resistor ladders in a similar manner in accordance with their respective reference voltage levels. In addition, two extra connection wires 312a and 312b are provided between V21+ and V43− and between V21− and V43+ to improve linearity of the resistor ladder, as may be desired. Further, due to the symmetrical property of the resistor ladders 308a and 308b, node V43+ and V21−, as well as node V21+ and V43− share the same differential reference voltage potential.

According to another exemplary aspect of the present invention, one ladder 308a in the resistor ladder is an S-shape series connected resistor chain and the other resistor ladder 308b is an S-shape series connected resistor chain and is oriented in a manner which is opposite the first ladder. Each ladder is powered with Vref+ and Vref− at its two terminals. According to one example, the two S-shaped, series connected resistor chains are coupled together at a point corresponding to intermediate portions of each resistor chain to improve resistor ladder linearity. The ladder chains are collectively operable to provide a first differential reference voltage level to the first pre-amplifier circuit associated with each of the folders, wherein one tap point for the first, second and third differential reference voltage levels for each respective first, second and third pre-amplifier circuit is located on one of the resistor chains and another tap point for the first, second and third differential reference voltage levels for each respective first, second and third pre-amplifier circuit is located on the other resistor chain, and wherein the tap points for each respective first, second and third pre-amplifier circuit for each folder are spatially located generally proximate to each other, thereby minimizing a connection complexity between the S-shaped resistor chains and each pre-amplifier circuit associated therewith.

The spatially configured voltage reference generation circuits 206 and 306 of architectures 200 and 300, respectively, overcome the disadvantages associated with the prior art. In addition, the new configured architecture may be extended to a general case of an N-to-1 architecture, wherein the resistor ladders are bent into N sections, wherein N is an integer greater than 1. In a manner similar to that described above, the proper differential reference voltage levels are properly derived by "jumping" between sections of the bent ladders, so that the appropriate reference voltage levels are spatially local to their respective folders. In the above manner, the input and output connections associated with the folder are simplified in complexity and reduced in distance.

Figure 4:
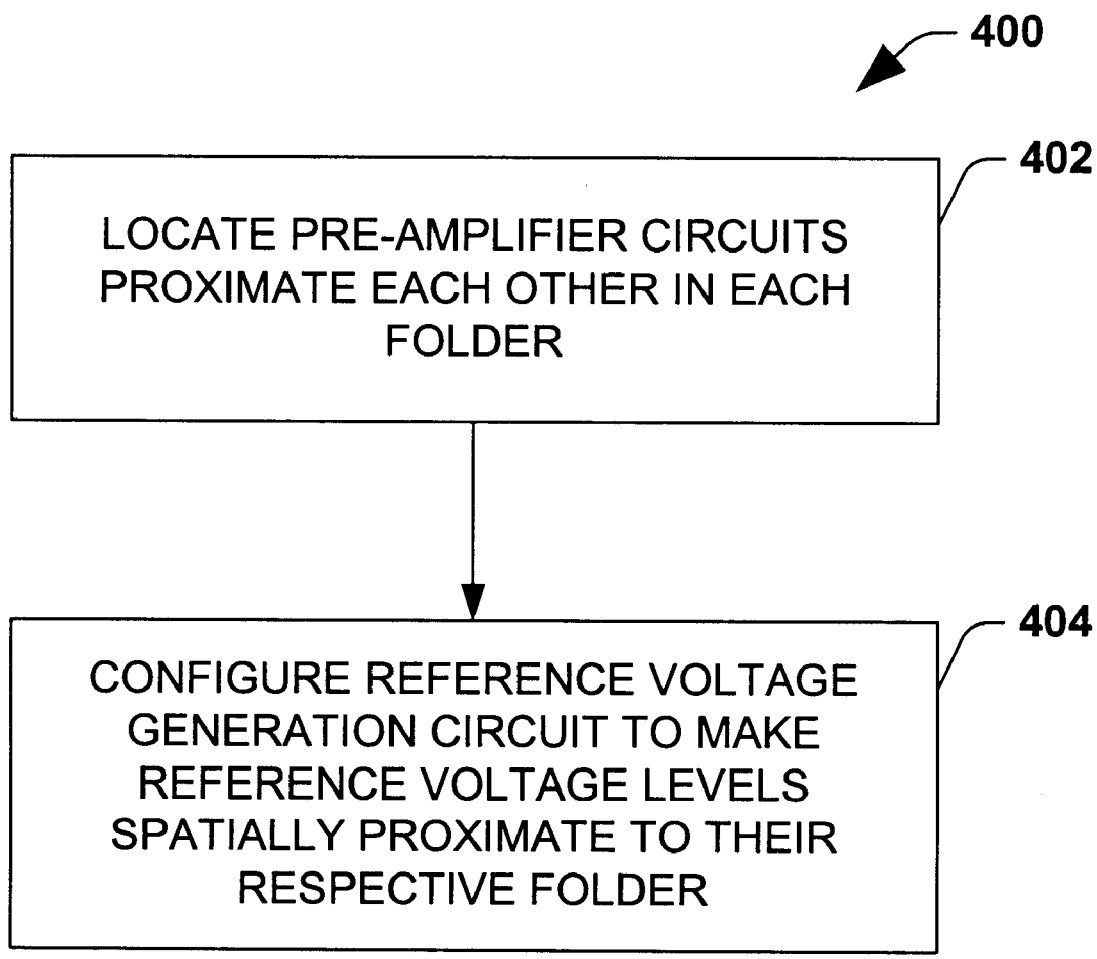
FIG. 4 is a flow chart diagram illustrating a method of reducing a connection distance and complexity between a reference voltage generation circuit and a plurality of folders in a folding type A/D converter according to yet another exemplary aspect of the present invention.

According to still another aspect of the present invention, a method of simplifying a connection complexity in a folding A/D converter is provided, as illustrated in FIG. 4 and designated at reference numeral 400. While for purposes of simplicity of explanation, the methodology of FIG. 4 is shown and described as a series of steps, it is to be understood and appreciated that the present invention is not limited to the order of steps, as some steps may, in accordance with the present invention, occur in different orders and/or concurrently with other steps from that shown and described herein.

The method 400 includes locating pre-amplifier circuits spatially proximate to one another within each folder at step 402 (e.g., as illustrated in FIGS. 2 and 3). As discussed above, laying out the pre-amplifier circuits which are associated with one another due to the folding mechanism close to one another, the folder output connection associated with the pre-amplifier circuits are reduced in line distance and complexity, which results in reduced parasitic capacitance at the folder outputs. The method 400 continues at step 404, where the reference voltage generation circuit is configured such that the differential reference voltage levels are laid out spatially proximate to their respective folder. Such a configuration greatly simplifies the connection complexity between the reference voltage generation circuit and the folder.

According to one exemplary aspect of the present invention, the reference voltage generation circuit comprises a resistor ladder network, and configuring the circuit may include spatially configuring the resistor ladder network such that tap points associated therewith which provide a selected plurality of differential reference voltage are selectively proximate each of the folders which employ such selected differential reference voltage levels. For example, in a 2-to-1 type folding architecture, the spatial configuring of the resistor ladder network may include configuring a first resistor ladder portion into U-shaped, series connected resistor chain operable to provide differential reference voltage levels to one of the pre-amplifier circuits associated with each of the folders. Tap points for the differential reference voltage levels for each pre-amplifier circuit are then located on opposite sides of the U-shaped resistor chain and spatially located proximate to each other, which minimizes a connection complexity between the resistor chain and each pre-amplifier circuit associated therewith.

In addition, configuring the resistor ladder network may further include configuring a second resistor ladder portion into a U-shaped, series- connected resistor chain oriented in a manner opposite the first resistor ladder portion. The second resistor chain is also operable to provide differential reference voltage levels to another one of the pre-amplifier circuits associated with each of the folders, and tap points for the differential reference voltage levels for each pre-amplifier circuit are located on opposite sides of the second U-shaped resistor chain and spatially located proximate to each other. Again, such a configuration minimizes a connection complexity between the resistor chain and each pre-amplifier circuit associated therewith.

Alternatively, in a 3-to-1 folding type configuration, the step of configuring may comprise spatially configuring the resistor ladder with network such that tap points associated therewith which provide a selected plurality of differential reference voltage are selectively proximate each of the folders which employ such selected differential reference voltage levels, as illustrated in FIG. 3.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given. or particular application. Furthermore, to the extent that the term "includes" is used in either the detailed description and the claims, such term is intended to be inclusive in a manner similar to the term "comprising."

What is claimed is:

1. A differential folding analog-to-digital converter architecture, comprising:
   a plurality of folders, wherein each of the plurality of folders comprises a plurality of pre-amplifier circuits, and wherein each of the folders is operable to generate a plurality of crossing points associated with the pre-amplifier circuits when an input signal changes in a full range, and further wherein the plurality of pre-amplifier circuits associated with each respective folder are located generally next to one another, thereby reducing a connection distance associated with the pre-amplifier circuits and an output node of each folder and reducing a parasitic capacitance associated with the output node; and a reference voltage generation circuit operable to provide a plurality of reference voltage levels to the plurality of folders, wherein the reference voltage generation circuit is configured to provide selected reference voltage levels spatially local to each of the plurality of folders, respectively, thereby reducing a connection complexity between the reference voltage generation circuit and the plurality of folders, wherein the reference voltage generation circuit further comprises a resistor ladder network comprising a plurality of series connected resistors operable to provide the plurality of reference voltage levels, wherein the resistor ladder network is spatially configured to provide selected reference voltage levels local to the respective folders employing such selected reference voltage levels.

wherein the resistor ladder network comprises:
      a first U-shaped, series connected resistor chain operable to provide differential reference voltage levels to one of the pre-amplifier circuits associated with each of the folders, wherein tap points for the differential reference voltage levels for each pre-amplifier circuit are located on opposite sides of the U-shaped resistor chain and spatially located proximate to each other, thereby minimizing a connection complexity between the resistor chain and each pre-amplifier circuit associated therewith; and a second U-shaped, series connected resistor chain oriented in a manner opposite the first U-shaped resistor chain, the second resistor chain operable to provide differential reference voltage levels to another one of the pre-amplifier circuits associated with each of the folders, wherein tap points for the differential reference voltage levels for each pre-amplifier circuit are located on opposite sides of the second U-shaped resistor chain and spatially located proximate to each other, thereby minimizing a connection complexity between the resistor chain and each pre-amplifier circuit associated therewith.

2. The architecture of claim 1, wherein the first U-shaped, series connected resistor chain is oriented right-side up, and the second U-shaped, series connected resistor chain is oriented up-side down.

3. A 2-to-1 differential folding n-bit analog-to-digital converter architecture, comprising:
   folder circuits, wherein represents a round-up integer of "X", wherein each of the folder circuits comprises a first pre-amplifier circuit and a second pre-amplifier circuit, wherein the first and second pre-amplifier circuits are operable to detect predetermined differential voltage levels associated with an analog input signal, thus making the folder circuits operable to generate a crossing point indication for each respective pre-amplifier circuit, and wherein the plurality of pre-amplifier circuits associated with each respective folder are located generally next to one another, thereby reducing a connection distance associated with the pre-amplifier circuits and an output node of each folder and reducing a parasitic capacitance associated with the output node; and a differential reference voltage level generation circuit operable to provide two unique differential reference voltage levels to each of folder circuit, wherein the differential reference voltage level generation circuit further comprises:

a first U-shaped, series connected resistor chain operable to provide a first differential reference voltage level to the first pre-amplifier circuit associated with each of the folders, wherein tap points for the first differential reference voltage level for each first pre-amplifier circuit are located on opposite sides of the U-shaped resistor chain and spatially located proximate to each other, thereby minimizing a connection complexity between the resistor chain and each pre-amplifier circuit associated therewith; and a second U-shaped, series connected resistor chain oriented in a manner opposite the first U-shaped resistor chain, the second resistor chain operable to provide a second differential reference voltage level to the second pre-amplifier circuit associated with each of the folders, wherein tap points for the second differential reference voltage level for each pre-amplifier circuit are located on opposite sides of the second U-shaped resistor chain and spatially located proximate to each other, thereby minimizing a connection complexity between the resistor chain and each pre-amplifier circuit associated therewith.

4. The architecture of claim 3, wherein the first U-shaped, series connected resistor chain is oriented right-side up, and the second U-shaped, series connected resistor chain is oriented up-side down.

5. A 3-to-1 differential folding n-bit analog-to-digital converter architecture, comprising:

folder circuits, wherein represents a round-up integer of "X", wherein each of the folder circuits comprises a first pre-amplifier circuit, a second pre-amplifier circuit, and a third pre-amplifier circuit, wherein the first, second and third pre-amplifier circuits are operable to detect predetermined differential voltage levels associated with an analog input signal, thus making the folder circuits operable to generate a crossing point indication for each respective pre-amplifier circuit, and wherein the plurality of pre-amplifier circuits associated with each respective folder are located generally proximate to one another, thereby reducing a connection distance associated with the pre-amplifier circuits and an output node of each folder and reducing a parasitic capacitance associated with the output node; and a differential reference voltage level generation circuit operable to provide three unique differential reference voltage levels to each of folder circuit, wherein the differential reference voltage level generation circuit further comprises:

two S-shaped, series connected resistor chains coupled together at a point corresponding to intermediate portions of each resistor chain, and collectively operable to provide the first, second and third differential reference voltage levels to the first, second and third pre-amplifier circuits associated with each of the folders, wherein one tap point for the first, second and third differential reference voltage levels for each respective first, second and third pre-amplifier circuit is located on one of the resistor chains and another tap point for the first, second and third differential reference voltage levels for each respective first, second and third pre-amplifier circuit is located on the other resistor chain, and wherein the tap points for each respective first, second and third pre-amplifier circuit for each folder are spatially located generally proximate to each other, thereby minimizing a connection complexity between the S-shaped resistor chains and each pre-amplifier circuit associated therewith.

6. The differential folding analog-to-digital converter architecture of claim 5, further comprising two conductive wires selectively coupled between the two S-shaped, series connected resistor chains, wherein the two conductive wires provide improved circuit linearity.

7. A method of reducing a connection distance between differential voltage reference levels and a plurality of folders in a folding analog-to-digital converter, comprising the steps of:

locating a plurality of pre-amplifier circuits proximate each other in each folder, wherein the pre-amplifier circuits of each folder are operable to provide an indication of crossing points with respect to different reference voltage levels associated with an analog input signal varying over its full range; and configuring a differential reference voltage generation circuit such that a selected plurality of generated different differential reference voltages are spatially proximate to each of the plurality of folders, respectively, thereby reducing a connection complexity between the differential reference voltage generation circuit and the plurality of folders, wherein the analog-to-digital converter comprises a 2-to-1 folding analog-to-digital architecture and the differential reference voltage generation circuit comprises a resistor ladder network, and wherein the step of configuring comprises spatially configuring the resistor ladder network such that tap points associated therewith which provide a selected plurality of differential reference voltage are selectively proximate each of the folders which employ such selected differential reference voltage levels, wherein the step of spatially configuring the resistor ladder network comprises:

configuring a first resistor ladder portion into U-shaped, series connected resistor chain operable to provide differential reference voltage levels to one of the pre-amplifier circuits associated with each of the folders, wherein tap points for the differential reference voltage levels for each pre-amplifier circuit are located on opposite sides of the U-shaped resistor chain and spatially located proximate to each other, thereby minimizing a connection complexity between the resistor chain and each pre-amplifier circuit associated therewith; and configuring a second resistor ladder portion into a U-shaped, series connected resistor chain oriented in a manner opposite the first resistor ladder portion, the second resistor chain operable to provide differential reference voltage levels to another one of the pre-amplifier circuits associated with each of the folders, wherein tap points for the differential reference voltage levels for each pre-amplifier circuit are located on opposite sides of the second U-shaped resistor chain and spatially located proximate to each other, thereby minimizing a connection complexity between the resistor chain and each pre-amplifier circuit associated therewith.

8. The method of claim 7, wherein the first U-shaped resistor ladder portion is oriented right-side up, and the second U-shaped resistor ladder portion is oriented-up-side down.

9. A method of reducing a connection distance between differential voltage reference levels and a plurality of folders in a folding analog-to-digital converter, comprising the steps of:

locating a plurality of pre-amplifier circuits proximate each other in each folder, wherein the pre-amplifier circuits of each folder are operable to provide an indication of crossing points with respect to different reference voltage levels associated with an analog input signal varying over its full range; and configuring a differential reference voltage generation circuit such that a selected plurality of generated different differential reference voltages are spatially proximate to each of the plurality of folders, respectively, thereby reducing a connection complexity between the differential reference voltage generation circuit and the plurality of folders, wherein the analog-to-digital converter comprises a 3-to-1 folding analog-to-digital architecture and the differential reference voltage generation circuit comprises a resistor ladder network, and wherein the step of configuring comprises spatially configuring the resistor ladder network such that tap points associated therewith which provide a selected plurality of differential reference voltage are selectively proximate each of the folders which employ such selected differential reference voltage levels.

10. A N-to-1 differential folding n-bit analog-to-digital converter architecture, comprising:

folder circuits, wherein represents a round-up integer of "X", wherein each of the folder circuits comprises a first pre-amplifier circuit, a second pre-amplifier circuit, and an Nth pre-amplifier circuit, and wherein the pre-amplifier circuits are operable to detect predetermined differential voltage levels associated with an analog input signal, thus making the folder circuits operable to generate a crossing point indication for each respective pre-amplifier circuit, and wherein the plurality of pre-amplifier circuits associated with each respective folder are located generally next to one another, thereby reducing a connection distance associated with the pre-amplifier circuits and an output node of each folder and reducing a parasitic capacitance associated with the output node; and a differential reference voltage level generation circuit operable to provide two unique differential reference voltage levels to each of folder circuit, wherein the differential reference voltage level generation circuit further comprises:

two series connected resistor chains each bent into N sections, and operable to provide a plurality of differential reference voltage levels to selected ones of the pre-amplifier circuits associated with the folders, wherein tap points for the various differential reference voltage levels are located on a same section of each resistor chain and spatially located vertically proximate to each other, thereby minimizing a connection complexity between the resistor chain and each pre-amplifier circuit associated therewith.

* * * * *